United States Patent
Hasegawa et al.

(10) Patent No.: US 8,216,942 B2
(45) Date of Patent: Jul. 10, 2012

(54) METHOD FOR MANUFACTURING SEMICONDUCTOR DEVICE

(75) Inventors: Makoto Hasegawa, Yokohama (JP);
Katsunori Yahashi, Yokohama (JP);
Shuichi Taniguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 877 days.

(21) Appl. No.: 12/274,076

(22) Filed: Nov. 19, 2008

(65) Prior Publication Data
US 2009/0130851 A1    May 21, 2009

(30) Foreign Application Priority Data
Nov. 21, 2007  (JP) ................................ 2007-301746

(51) Int. Cl.
*H01L 21/311* (2006.01)
(52) U.S. Cl. ........ 438/694; 438/689; 438/692; 438/696; 216/37; 257/773
(58) Field of Classification Search ............. 438/689, 438/692, 694, 696; 257/773
See application file for complete search history.

(56) References Cited

U.S. PATENT DOCUMENTS

| | | | |
|---|---|---|---|
| 7,923,365 B2 * | 4/2011 | Kim et al. ................. | 438/596 |
| 2007/0290232 A1 | 12/2007 | Nishiyama | |
| 2008/0017992 A1 * | 1/2008 | Kito et al. ................. | 257/773 |
| 2008/0063986 A1 | 3/2008 | Jung | |

FOREIGN PATENT DOCUMENTS

| | | | |
|---|---|---|---|
| JP | 2002-280388 | | 9/2002 |
| JP | 2002-280388-MT | * | 9/2002 |

* cited by examiner

*Primary Examiner* — Nadine G Norton
*Assistant Examiner* — Maki Angadi
(74) *Attorney, Agent, or Firm* — Finnegan, Henderson, Farabow, Garrett & Dunner, L.L.P.

(57) ABSTRACT

A method for manufacturing a semiconductor device, comprises forming a first film above a pattern forming material, patterning the first film to form a core material pattern, forming a second film above the pattern forming material so as to cover a side surface and an upper surface of the core material pattern, forming a third film above the second film as a protective material for the second film, etching the second and third films so that side wall sections including the second film and the third film are formed on both sides of the core material pattern and the second film and the third film of an area other than the side wall sections are removed, removing the core material pattern between the side wall sections, and transferring patterns corresponding to the side wall sections on the pattern forming material by using the side wall sections as a mask.

20 Claims, 4 Drawing Sheets

| SIDE WALL TRANSCRIPION MASK MATERIAL | SIDE WALL PROTECTIVE MATERIAL |
|---|---|
| a-Si | THERMALLY-OXIDIZED FILM, TEOS, BSG, $Si_3N_4$ |
| $Si_3N_4$ | THERMALLY-OXIDIZED FILM, a-Si, Poly-Si |
| TEOS | a-Si, Poly-Si |
FIG. 3
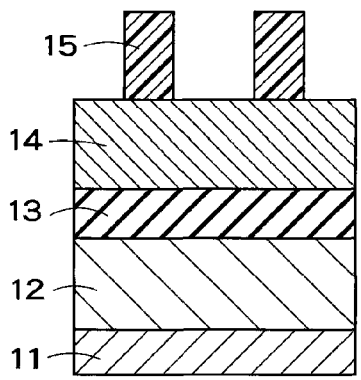
FIG. 4A
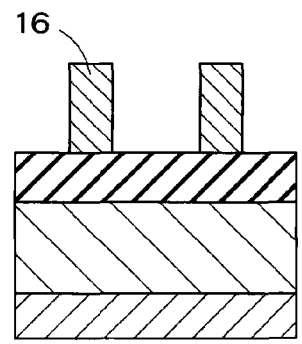
FIG. 4B
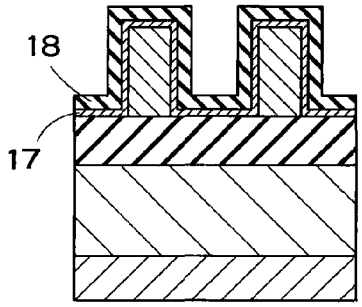
FIG. 4C
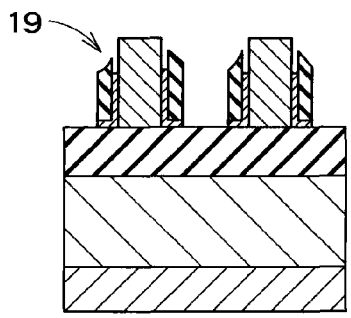
FIG. 4D
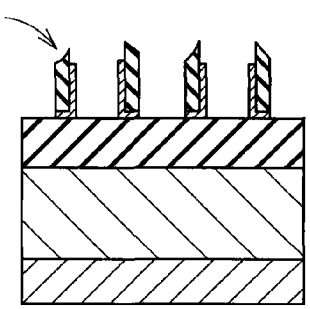
FIG. 4E
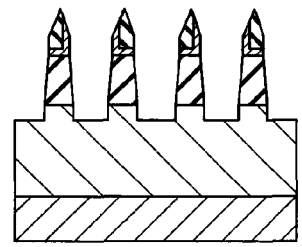
FIG. 4F

METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2007-301746, filed on Nov. 21, 2007, the entire contents of which are incorporated herein by reference.

BACKGROUND OF THE INVENTION

1. Field of the Invention

The present invention relates to a method for manufacturing a semiconductor device in which a fine pattern is formed by patterning a pattern forming material by transcription technology, while using a core material pattern formed on the pattern forming material.

2. Related Art

Manufacturing processes of forming a pattern utilizing transcription technology are known; see JP-A (Kokai) 2002-280388. In such kind of manufacturing processes, a side wall transcription process has been spotlighted in which a side wall section formed on a side surface of a core material pattern on a pattern forming material is printed to the pattern forming material to form the pattern of the same shape as the side wall section. The core material pattern means a pattern made of the core material, and the pattern forming material means a material for making a final pattern. With the side wall transcription process, it is possible to form a finer pattern of a half the pitch or less of the core material pattern formed by patterning by lithography, thereby increasing the degree of integration twice or more.

However, in the side wall transcription process in related art, since a vicinity of the tip of the side wall section is rounded and thus the width thereof becomes narrow, it is difficult to make the width of the side wall section uniform. Accordingly, there has been a problem in that the width of the pattern printed on the pattern forming material also becomes uneven.

SUMMARY OF THE INVENTION

According to one aspect of the present invention, a method for manufacturing a semiconductor device, comprises:

forming a first film above a pattern forming material;

patterning the first film to form a core material pattern;

forming a second film above the pattern forming material so as to cover a side surface and an upper surface of the core material pattern;

forming a third film above the second film as a protective material for the second film;

etching the second and third films so that side wall sections including the second film and the third film are formed on both sides of the core material pattern and the second film and the third film of an area other than the side wall sections are removed;

removing the core material pattern between the side wall sections; and transferring patterns corresponding to the side wall sections on the pattern forming material by using the side wall sections as a mask.

According to the other aspect of the present invention, a method for manufacturing a semiconductor device, comprises:

forming a mask film on a pattern forming material;

forming a first film on the mask film;

patterning the first film to form a core material pattern;

forming a second film on the mask film so as to cover a side surface and an upper surface of the core material pattern;

forming a third film on the second film as a protective material for the second film;

etching the second and third films so that side wall sections including the second film and the third film are formed on both sides of the core material pattern and the second film and the third film of an area other than the side wall sections are removed;

removing the core material pattern between the side wall sections; and transferring patterns corresponding to the side wall sections sequentially on the mask film and the pattern forming material after removing the core material pattern.

BRIEF DESCRIPTION OF THE DRAWINGS

FIG. 3 is a chart showing examples of material combinations for a side wall transcription mask material 6 and a side wall protective material 7;

FIGS. 4A to 4F are drawings showing a manufacturing process of a semiconductor device according to a third embodiment of the present invention.

DETAILED DESCRIPTION OF THE INVENTION

Embodiments according to the present invention will now be explained with reference to the accompanying drawings.

(First Embodiment)

FIG. 1 shows a manufacturing process of a semiconductor device according to a first embodiment of the present invention. First, as shown in FIG. 1A, on a semiconductor substrate not shown, a tetraethyl orthosilicate (TEOS) film 1 which serves as a pattern forming material is formed. Next, on the TEOS film 1, by chemical vapor deposition (CVD), a $Si_3N_4$ film which is a material for a core material pattern 2 is formed. The film thickness of the $Si_3N_4$ film determines the film thickness of the core material pattern 2. Then, the $Si_3N_4$ film is patterned by lithography and by reactive ion etching (RIE). More specifically, a pattern is formed within the resolution limit of the lithography and then a slimming treatment of the $Si_3N_4$ film by plasma etching is carried out to form the core material pattern 2 having a pattern of a desired width.

Figure 1A:
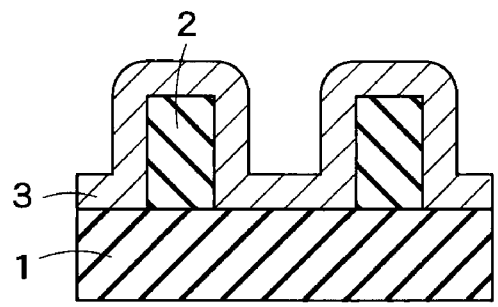
FIGS. 1A to 1E are drawings showing a manufacturing process of a semiconductor device according to a first embodiment of the present invention.

Next, as shown in FIG. 1A, an amorphous silicon film, hereinafter referred to as a-Si film, 3 is formed so as to cover a side surface and an upper surface of the core material pattern 2 by CVD. In this case, since the a-Si film 3 is formed conformally, a shoulder portion of the a-Si film 3 becomes rounded.

Figure 1B:
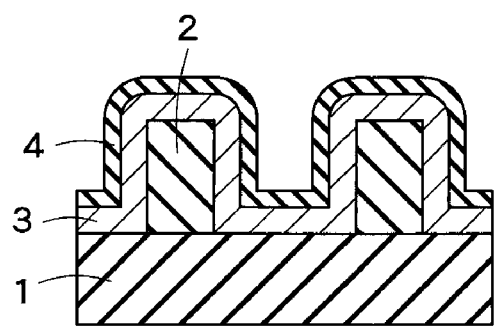

Then, as shown in FIG. 1B, an oxidation treatment by plasma on an upper surface of the a-Si film 3 is carried out to modify the upper surface thereof so as to form a silicon oxide film (hereinafter referred to as Si-oxide film) 4 which has a film thickness of a few nanometers to a few tens of nanometers and serves as a protective material for the side wall.

Figure 1C:
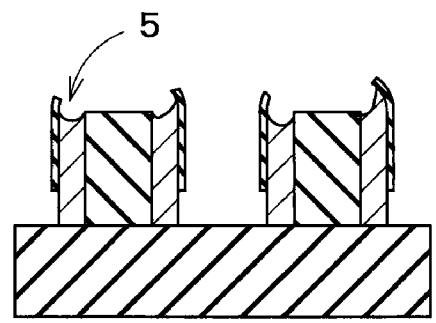

Next, as shown in FIG. 1C, the a-Si film 3 and the Si-oxide film 4 are etched back to remove the a-Si film 3 and the Si-oxide film 4 of an area other than a side wall section 5 of the core material pattern 2.

In this case, plasma etching is carried out to etch back the a-Si film 3 and the Si-oxide film 4. In the plasma etching, since the etching selectivity of the a-Si film 3 to the Si-oxide film 4 is set larger, the a-Si film 3 is removed more aggressively. Therefore, at a shoulder portion of the side wall section 5, a thin layer of the Si-oxide film 4 remains as the protective material, thus rounding of the shoulder portion is prevented.

Consequently, the side wall section 5 obtained as described above has a double-layered structure of the a-Si film 3 and the Si-oxide film 4, and the rounding of the tip vicinity thereof is prevented. If the Si-oxide film 4 is not formed on the a-Si film 3, when the a-Si film 3 is etched back, the tip vicinity of the side wall section 5 becomes rounded and the width of the tip vicinity becomes narrow.

As described above, in the first embodiment, by forming the Si-oxide film 4 on the a-Si film 3 prior to etching back the a-Si film 3, the width of the side wall section 5 can be prevented from varying.

The width of the side wall section 5 after the a-Si film 3 and the Si-oxide film 4 are etched is approximately the same as the film thickness of the a-Si film 3 since the Si-oxide film 4 at the shoulder section is extremely thin. Thus, when transferring the side wall section 5 onto the underlying film, the a-Si film 3 exclusively serves as a side wall transcription mask material and defines the width of the pattern transferred.

Figure 1D:
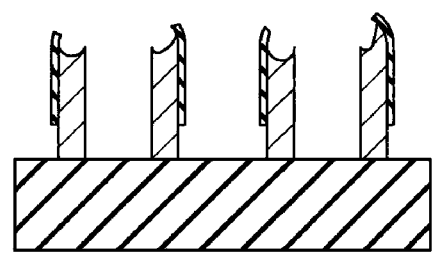

Next, by RIE, the core material pattern 2 is removed. Consequently, on the TEOS film 1, as shown in FIG. 1D, only the side wall section 5 remains.

Figure 1E:
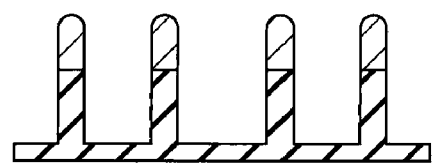

Then, by RIE, with the side wall section 5 as a mask, the TEOS film 1 is patterned by transferring onto the TEOS film 1, as shown in FIG. 1E. In this case, although the thin Si-oxide film 4 at the shoulder portion of the side wall section 5 is etched away, since there is not much roundness on the a-Si film 3 on the remaining side wall section 5 and the width thereof is nearly constant, there is not much variance in the width of the pattern formed on the TEOS film 1 when transferred onto the TEOS film 1. Consequently, the pattern of a desired shape can be formed on the TEOS film 1 with high accuracy.

When the Si-oxide film 4 is not formed on the a-Si film 3 and the a-Si film 3 is etched back to form the side wall section 5, the tip vicinity of the side wall section 5 is likely to be rounded. Therefore, in order to prevent the side wall section 5 from rounding, the film thickness of the a-Si film 3 is required to be made larger. However, in the first embodiment, since the side wall section 5 is less likely to be rounded, the film thickness of the a-Si film 3 is not required to be made larger, thereby improving the productivity.

As described above, in the first embodiment, since the side wall section 5 has a double-layered structure in which the a-Si film 3 and the Si-oxide film 4 are formed so as to cover the side surface and the upper surface of the core material pattern 2. Therefore, when etching the a-Si film 3 and the Si-oxide film 4 back thereafter, the width of the side wall section 5 is not varied, thereby improving the accuracy of the patterning of the TEOS film 1.

(Second Embodiment)

A second embodiment of the present invention provides a manufacturing process being partly different from that of the first embodiment.

FIG. 2 shows a manufacturing process of a semiconductor device of the second embodiment. By the same method as that of the first embodiment, the core material pattern 2 is formed, as shown in FIG. 2A, and then, a layered structure film composed of a side wall transcription mask material 6 and a side wall protective material 7 is formed by CVD, as shown in FIG. 2B.

Figure 2A:
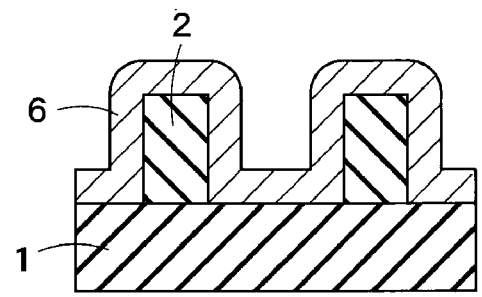
FIGS. 2A to 2E are drawings showing a manufacturing process of a semiconductor device according to a second embodiment of the present invention.
Figure 2B:
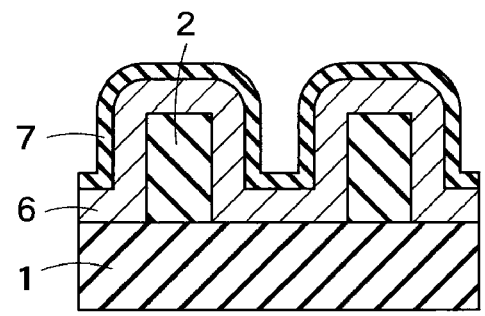
Figure 2C:
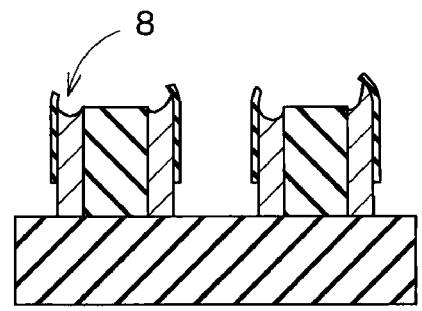
Figure 2D:
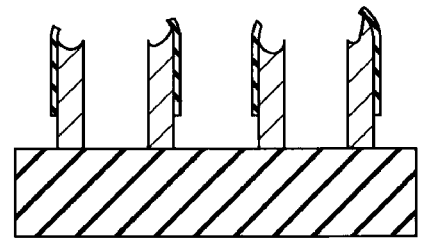
Figure 2E:
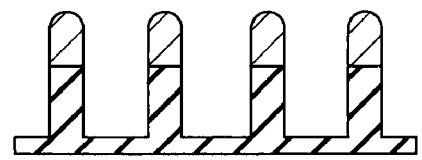

The side wall transcription mask material 6 and the side wall protective material 7 are the materials excellent in selectivity in plasma etching. The etching rate of the side wall transcription mask material 6 is larger than the etching rate of the side wall protective material 7. Therefore, by carrying out the plasma etching after the layered structure film is formed, the side wall protective material 7 on a side wall section 8 of the core material pattern 2 remains without being removed, thereby preventing the shoulder of the side wall section 8 from being rounded, as shown in FIG. 2C. The subsequent processes are the same as those of the first embodiment.

FIG. 3 is a chart showing examples of material combinations for the side wall transcription mask material 6 and the side wall protective material 7. When a-Si is used for the side wall transcription mask material 6, a thermally-oxidized film, TEOS, boron silicate glass (BSG), $Si_3N_4$ or the like is used for the side wall protective material 7. When $Si_3N_4$ is used for the side wall transcription mask material 6, a thermally-oxidized film, a-Si or polysilicon (referred to as Poly-Si in FIG. 3), or the like are used for the side wall protective material 7. When TEOS is used for the side wall transcription mask material 6, a-Si, polysilicon, or the like are used for the side wall protective material 7.

FIG. 3 shows merely an example and, as long as selectivity in plasma etching is excellent, combinations other than those shown in FIG. 3 may be adopted.

As described above, in the second embodiment, since the side wall section in a double-layered structure is formed by forming the layered structure film of an excellent selectivity so as to cover the side surface and the upper surface of the core material pattern 2 and then etching it back, the shoulder portion of the side wall section can be avoided from being rounded as in the first embodiment, thereby improving the accuracy of the pattern width obtained when the transcription onto the underlying TEOS film 1 is carried out thereafter.

(Third Embodiment)

A third embodiment of the present invention provides a method for forming a side wall section different from those of the first and second embodiments.

FIG. 4 shows a manufacturing process of a semiconductor device of the third embodiment. FIG. 4 shows an example of a manufacturing process of forming a gate by using transcription technology.

First, a pattern forming material 12 which serves as a material for the gate, a first mask material 13, and a second mask material 14 are deposited in sequence on a substrate 11, and thereafter, a resist pattern 15 is formed on the second mask material 14, as shown in FIG. 4A. The pattern forming material 12 is, for example, of a polysilicon film with impurity ions implanted. The first mask material 13 is, for example, of a Si-oxide film. The second mask material 14 is, for example, of SiN when the material for the side wall section is polysilicon, and of polysilicon when the material for the side wall section is SiN.

Then, the resist pattern 15 is transferred to the second mask material 14 to form a core material pattern 16 which is finer than the resist pattern 15, as shown in FIG. 4B.

Next, so as to cover a side surface and an upper surface of the core material pattern 16, a first side wall forming film 17 which serves as a side wall transcription mask material is formed by CVD, and then a second side wall forming film 18 which becomes as a side wall protective material is deposited thereon by CVD, as shown in FIG. 4C.

The first side wall forming film 17 and the second side wall forming film 18 are of the same main element, and the film materials are selected so that the etching rate of the first side wall forming film 17 is larger than that of the second side wall forming film 18. For example, the first side wall forming film 17 is formed by ion-implanted polysilicon with phosphorus as an impurity, while the second side wall forming film 18 is formed by polysilicon without any impurities.

With the main elements of the first side wall forming film 17 and the second side wall forming film 18 being polysilicon, when one of the films is ion-implanted with phosphorus as an impurity ion at an impurity concentration of $5 \times 10^{15}$ ion/cm$^2$, and an etching gas of hydrogen bromide (HBr) and such is used, an etching rate difference will be about 1.2 times. When arsenal is implanted as impurity ions, a difference in etching rate will be similar. In addition, when the main elements of the first side wall forming film 17 and the second side wall forming film 18 are SiN, and one of the films is ion-implanted with hydrogen as an impurity ion at an impurity concentration of $5 \times 10^{15}$ ion/cm$^2$, by using $CH_3F$ and the like as an etching gas, an etching rate difference will be about 1.2 times.

Next, both the first side wall forming film 17 and the second side wall forming film 18 are etched back by RIE of anisotropic etching using HBr and such to form a side wall section 19 on the side surface of the core material pattern 16, as shown in FIG. 4D. In this case, since the first side wall forming film 17 is ion-implanted with phosphorus, the etching rate is larger than that of the second side wall forming film 18 and thus, as shown in FIG. 4D, the height of the second side wall forming film 18 at the side wall section 19 is higher than that of the first side wall forming film 17. While a facet is formed at the tip vicinity of the second side wall forming film 18 of the side wall section 19, the side wall section 19 has a nearly symmetrical shape from its bottom to tip vicinity, thus the variation in the width of the side wall section 19 is small.

Next, by RIE and such, the core material pattern 16 is removed, as shown in FIG. 4E. Consequently, only the side wall section 19 composed of the first side wall forming film 17 and the second side wall forming film 18 is formed on the first mask material 13. In this case, if the shape of the side wall section 19 is largely asymmetric, it is possible to control the shape by carrying out RIE again using HBr and such.

Next, by RIE, with the side wall section 19 as a mask, the transcription to the first mask material 13 is carried out to selectively etch the first mask material 13, as shown in FIG. 4F. Subsequently, with the selectively etched first mask material 13 as a mask, the pattern forming material 12 is selectively etched by RIE to form a gate pattern of the corresponding shape to the side wall section 19.

As described above, in the third embodiment, the main element of the first side wall forming film 17 is the same as that of the second side wall forming film 18, which are layered so as to cover the core material pattern 16. By implanting impurity ions to one of the films, the etching rate of the first side wall forming film 17 is made larger than that of the second side wall forming film 18. Consequently, when etching back the first side wall forming film 17 and the second side wall forming film 18, the second side wall forming film 18 is formed higher than the first side wall forming film 17 on the side wall section 19. Accordingly, the facet of the tip portion of the side wall section 19 is not likely to cause an asymmetrical shaping, thereby preventing the pattern width of the underlying film from varying when the transcription thereto is carried out thereafter.

(Fourth Embodiment)

A fourth embodiment of the present invention is an embodiment of the first side wall forming film 17 and the second side wall forming film 18 having a difference in film stress therebetween.

FIG. 5 shows a manufacturing process of a semiconductor device according to the fourth embodiment. A first side wall forming film 17a and a second side wall forming film 18a are layered by CVD and such in the same manner as those described in the third embodiment, as shown in FIGS. 5A to 5C. While the first side wall forming film 17a and the second side wall forming film 18a are of the same main element, the first side wall forming film 17a has a larger film stress than that of the second side wall forming film 18a.

Figure 5A:
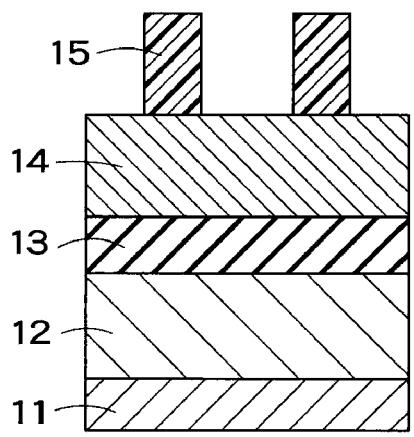
FIGS. 5A to 5F are drawings showing a manufacturing process of a semiconductor device according to a fourth embodiment of the present invention.
Figure 5B:
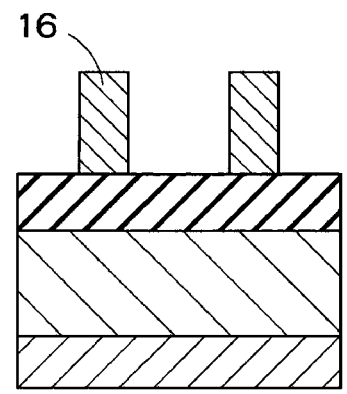
Figure 5C:
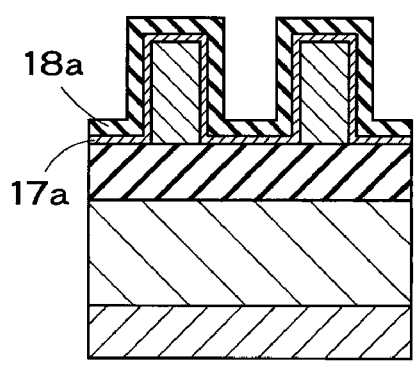
Figure 5D:
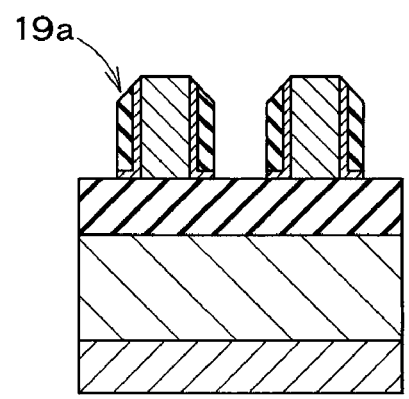

For example, the first side wall forming film 17a is a silicon nitride film of a film stress of 950 MPa deposited by plasma CVD, while the second side wall forming film 18a is a silicon nitride film of a film stress of 900 MPa deposited by plasma CVD. The first side wall forming film 17a and the second side wall forming film 18a are etched back by carrying out anisotropic etching by RIE using $CH_2F_2$ and such to form a side wall section 19a on the side surface of the core material pattern 16, as shown in FIG. 5D. In this case, facets are formed in the tip vicinities of the first side wall forming film 17a and the second side wall forming film 18a, and the height of the side wall section 19a becomes lower at a distance farther away from the core material pattern 16.

As an example of providing a film stress, a silicon nitride film which is the material for the first side wall forming film 17a or the second side wall forming film 18a is introduced with hydrogen while applying an ion impact thereto in order to increase a number of atoms per unit volume so that the silicon nitride film can have a stress to expand itself, more specifically, a compression stress. On the contrary, a silicon nitride film is introduced with hydrogen while applying not much ion impacts thereto, and is then heat-treated and such to have the hydrogen in the film extracted in order to decrease the number of atoms per unit volume so that the silicon nitride film can have a stress to contract itself, more specifically, a tension stress.

For example, the compression stress is given to the first side wall forming film 17a, while the tension stress is given to the second side wall forming film 18a.

Figure 5E:
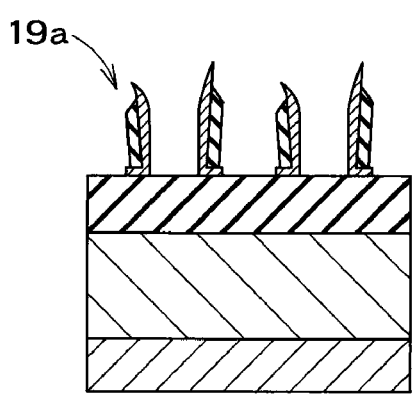

Next, by RIE and such, the core material pattern 16 is removed to make only the side wall section 19a remain on the first mask material 13, as shown in FIG. 5E. In this case, the first side wall forming film 17a and the second side wall forming film 18a which constitute the side wall section 19a deform by the respective film stresses. When the first side wall forming film 17a is of a 15 nm thick silicon nitride film having a film stress of 950 MPa deposited by CVD and the second side wall forming film 18a is of a 15 nm thick silicon nitride film having a film stress of 900 MPa deposited by CVD, as shown in FIG. 5E, the side wall section 19a is shaped with a slant of about 15 nm towards the space between the core material patterns 16. The slant can be changed by changing the film stresses and the film thicknesses of the first side wall forming film 17a and the second side wall forming film 18a. Consequently, although the side wall section 19a has a slight slant, the width of the side wall section 19a is prevented from varying.

Figure 5F:
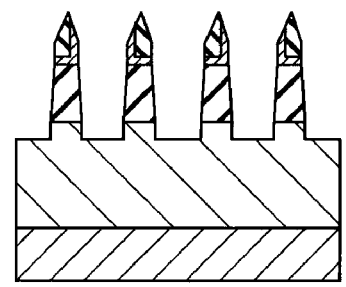

Next, as in the third embodiment, by using the side wall section 19a as a mask, the transcription to the first mask material 13 is carried out by RIE to selectively etch the first mask material 13. Subsequently, by using the selectively etched first mask material 13 as a mask, the pattern forming material 12 is selectively etched by RIE to form a gate pattern of the corresponding shape to the side wall section 19*a*, as shown in FIG. 5F.

As described above, in the fourth embodiment, the magnitude of film stress of both the first side wall forming film 17*a* and the second side wall forming film 18*a* which are layered so as to cover the core material pattern 16 are adjusted so that the film stress of the first side wall forming film 17*a* is made larger than that of the second side wall forming film 18*a*. Consequently, when the first side wall forming film 17*a* and the second side wall forming film 18*a* are etched back, both the first side wall forming film 17*a* and the second side wall forming film 18*a* can remain on the side wall section 19*a*, thereby preventing the width of the side wall section 19*a* from varying. As a result, when transferring the side wall section 19*a* to the underlying film, the pattern width does not vary.

While FIGS. 1 and 2 illustrate an example of the core material pattern 2 being formed directly on the pattern forming material 1, and FIGS. 4 and 5 illustrate an example of the core material pattern 16 being formed on the pattern forming material 12 with the first mask material 13 therebetween, the number of layers disposed between the pattern forming material 12 and the core material pattern 16 is not limited.

While the second embodiment illustrates an example of forming the side wall transcription mask material 6 and the side wall protective material 7 using the materials of different etching rates, as in the third embodiment, etching rates thereof may be changed by changing the amount of impurity ions implanted while the main element of the side wall transcription mask material 6 is the same as that of the side wall protective material 7. Further, as in the fourth embodiment, the side wall transcription mask material 6 and the side wall protective material 7 may have a different film stress.

The third embodiment illustrates an example in which the main element of the first side wall forming film 17 is the same as that of the second side wall forming film 18, and the amount of the injected impurity ions is different between the films 17 and 18. However, as in the second embodiment, the first side wall forming film 17 and the second side wall forming film 18 may be formed with the materials of different etching rates. Further, as in the first embodiment, the second side wall forming film 18 may be formed by modifying the upper surface of the first side wall forming film 17.

The invention claimed is:

1. A method for manufacturing a semiconductor device, comprising:
   forming a first film above a pattern forming material;
   patterning the first film to form a core material pattern;
   forming a second film above the pattern forming material so as to cover a side surface and an upper surface of the core material pattern;
   forming a third film above the second film as a protective material for the second film;
   etching the second and third films so that side wall sections including the second film and the third film are formed on both sides of the core material pattern and the second film and the third film of an area other than the side wall sections are removed;
   removing the core material pattern between the side wall sections; and
   transferring patterns corresponding to the side wall sections on the pattern forming material by using the side wall sections as a mask.

2. The method according to claim 1, wherein the third film is formed by modifying a surface of the second film.

3. The method according to claim 2, wherein the third film is formed by carrying out a plasma oxidation process on a surface of the second film.

4. The method according to claim 2, wherein the third film is thinner than the second film, and a width of the transferred patterns is determined by the width of the second film remaining in the side wall sections.

5. The method according to claim 1, wherein when etching the second and the third films, a plasma etching is carried out.

6. The method according to claim 1, wherein an etching rate of the second film is faster than that of the third film.

7. The method according to claim 6, wherein a main element of the second film is the same as that of the third film, and an impurity concentration of the second film is different from that of the third film so that the etching rate of the second film is faster than that of the third film.

8. The method according to claim 1, wherein the second film and the third film are formed by CVD.

9. The method according to claim 1, wherein a film stress of the second film is larger than that of the third film.

10. The method according to claim 9, wherein a film stress of the second film is made larger than that of the third film by adjusting magnitude of an ion impact applied to at least one of the second film and the third film.

11. A method for manufacturing a semiconductor device, comprising:
    forming a mask film on a pattern forming material;
    forming a first film on the mask film;
    patterning the first film to form a core material pattern;
    forming a second film on the mask film so as to cover a side surface and an upper surface of the core material pattern;
    forming a third film on the second film as a protective material for the second film;
    etching the second and third films so that side wall sections including the second film and the third film are formed on both sides of the core material pattern and the second film and the third film of an area other than the side wall sections are removed;
    removing the core material pattern between the side wall sections; and
    transferring patterns corresponding to the side wall sections sequentially on the mask film and the pattern forming material after removing the core material pattern.

12. The method according to claim 11, wherein the third film is formed by modifying a surface of the second film.

13. The method according to claim 12, wherein the third film is formed by carrying out a plasma oxidation process on a surface of the second film.

14. The method according to claim 12, wherein the third film is thinner than the second film, and a width of the transferred patterns is determined by the width of the second film remaining in the side wall sections.

15. The method according to claim 11, wherein when etching the second and the third films, a plasma etching is carried out.

16. The method according to claim 11, wherein an etching rate of the second film is faster than that of the third film.

17. The method according to claim 16, wherein a main element of the second film is the same as that of the third film, and an impurity concentration of the second film is different from that of the third film so that the etching rate of the second film is faster than that of the third film.

18. The method according to claim 11, wherein the second film and the third film are formed by CVD.

19. The method according to claim 11, wherein a film stress of the second film is larger than that of the third film.

20. The method according to claim 19, wherein a film stress of the second film is made larger than that of the third film by adjusting magnitude of an ion impact applied to at least one of the second film and the third film.